US009293694B2

(12) United States Patent
Yi et al.

(10) Patent No.: US 9,293,694 B2
(45) Date of Patent: Mar. 22, 2016

(54) MAGNETORESISTIVE RANDOM ACCESS MEMORY CELL WITH INDEPENDENTLY OPERATING READ AND WRITE COMPONENTS

(76) Inventors: Ge Yi, San Ramon, CA (US); Shaoping Li, San Ramon, CA (US); Dong Li, San Ramon, CA (US); Yunjun Tang, Pleasanton, CA (US); Zongrong Liu, Pleasanton, CA (US)

( * ) Notice: Subject to any disclaimer, the term of this patent is extended or adjusted under 35 U.S.C. 154(b) by 0 days.

(21) Appl. No.: 13/288,860

(22) Filed: Nov. 3, 2011

(65) Prior Publication Data
US 2013/0114334 A1    May 9, 2013

(51) Int. Cl.
*G11C 11/00* (2006.01)
*H01L 43/08* (2006.01)
*G11C 11/16* (2006.01)

(52) U.S. Cl.
CPC ............... *H01L 43/08* (2013.01); *G11C 11/16* (2013.01)

(58) Field of Classification Search
CPC ................ G11C 11/15; G11C 11/16

USPC ......................................... 365/158, 171, 173
See application file for complete search history.

(56) References Cited

U.S. PATENT DOCUMENTS

2007/0058422 A1*  3/2007  Phillips et al. ................ 365/158

* cited by examiner

*Primary Examiner* — Huan Hoang

(57) ABSTRACT

A new class of the memory cell is proposed. There are two separated pulse data writing and sensing current paths. The in-plane pulse current is used to flip the magnetization direction of the perpendicular-anisotropy data storage layer sandwiched between a heavy metal writing current-carrying layer and a dielectric layer. The magnetization state within data storage layer is detected by the patterned perpendicular-anisotropy tunneling magnetoresistive (TMR) stack via the output potential of the stack. Two detailed memory cells are proposed: in one proposed cell, the data storage layer is independent from but kept close to the sensing TMR stack, whose magnetization orientation affects magnetization configuration within the free layer of the TMR stack, therefor ultimately affects the output potential of the stack; in the other proposed cell, the perpendicular-anisotropy data storage layer is the free layer of the sensing TMR stack, whose magnetization state will directly affect the output potential of the stack when sensing current passes through.

20 Claims, 9 Drawing Sheets

Magnetoresistive random access memory cell with independently operating read and write components, by Ge Yi, et. al.

Magnetoresistive random access memory cell with independently operating read and write components, by Ge Yi, et. al.

Magnetoresistive random access memory cell with independently operating read and write components, by Ge Yi, et. al.

Magnetoresistive random access memory cell with independently operating read and write components, by Ge Yi, et. al.

Magnetoresistive random access memory cell with independently operating read and write components, by Ge Yi, et. al.

Magnetoresistive random access memory cell with independently operating read and write components, by Ge Yi, et. al.

Magnetoresistive random access memory cell with independently operating read and write components, by Ge Yi, et. al.

MAGNETORESISTIVE RANDOM ACCESS MEMORY CELL WITH INDEPENDENTLY OPERATING READ AND WRITE COMPONENTS

FIELD OF INVENTION

The invention is related to magnetoresistive random access memory (MRAM) cell, more specifically the MRAM cell consisting of independently operating read and write components. The data storage layer used in the memory cell is a thin magnetic layer (e.g. Co), with perpendicular anisotropy, sandwiched between a metal lead layer (e.g. Pt) and dielectric layer (e.g. MgO, AlOx). The read out sensing component is a tunneling magnetoresistive (TMR) stack, which is also referred in literature as magnetic tunneling junction (MTJ). Two new MRAM cells are proposed: in one embodiment, the storage layer is part of the TMR sensing stack (read stack); in the other embodiment, the storage layer is away from the TMR sensing stack (read stack), the magnetic flux emitted from the storage layer will change the magnetic configuration of the free layer of the sensing TMR stack, which can give out different output electrical potential (voltage) depending on the magnetic configuration in the storage layer. As such, the right magnetic configuration, which is correspondent to either "1" or "0", can be detected (read out). The invented MRAM cell enables the decouple of the read and write process of the active memory cell. During data writing, a reliable data write mechanism, as proposed by I. M. Miron et al. (I. M. Miron et. al, Nature 476, (2011) 189, "Perpendicular switching of a single ferromagnetic layer induced by in-plane current injection"), is used to flip the data storage layer without risk of device damage. During the read, the probing mechanism will not disturb stored data via a TMR sensing stack with large TMR ratio to ensure a large signal to noise ratio.

BACKGROUND ART

Data storage memory is one of the backbones of the modern information technology. Semiconductor memory in the form of Dynamic random-access memory (DRAM), Static random-access memory (SRAM) and flash memory has dominated the digital world for the last forty years. Comparing to DRAM based on transistor and capacitor, SRAM using the state of a flip-flop with large form factor is more expensive to produce but generally faster and less power consumption. Nevertheless, both DRAM and SRAM are volatile memory, which means they lost the information stored once the power is removed. Flash memory on the other hand is non-volatile memory and cheap to manufacture. However, flash memory has limited endurances of writing cycle and slow write though the read is relatively faster.

MRAM is relatively a new type of memory technology. It has the speed of the SRAM, density of the DRAM and it is non-volatile as well. If it is used to replace the DRAM in computer, it will not only give "instant on" but "always-on" status for operation system, and restore the system to the point when the system is power off last time. It could provide a single storage solution to replace separate cache (SRAM), memory (DRAM) and permanent storage (hard disk drive (HDD) or flash-based solid state drive (SSD)) on portable device at least. Considering the rapid growth of "cloud computing" technology, MRAM has a great potential and can be the key dominated technology in digital world.

MRAM stores the informative bit "1" or "0" into the two magnetic states in the so-called magnetic storage layer. The different states in the storage layer give two distinctive voltage outputs from the whole memory cell, normally a patterned TMR stack. The TMR stack provides a read out mechanism sharing the same well-understood physics as current magnetic reader used in conventional hard disk drive.

There are two kinds of existing MRAM technologies based on the write process: one kind, which can be labeled as the conventional magnetic field switched (toggle) MRAM, uses the magnetic field induced by the current in the remote write line to change the magnetization orientation in the data stored magnetic layer from one direction (i.e. "1") to the opposite direction (i.e. "0"). This kind of MRAM has more complicated cell structure and needs relative high write current (in the order of mA). It also has poor scalability beyond 65 nm because the write current in the write line needs to continue increase to ensure reliable switching the magnetization of the magnetic storage layer because of the fact that the smaller the physical dimension of the storage layer, the higher the magnetic coercivity it normally has for the same material. Nevertheless, the only commercially available MRAM so far is still based on this conventional writing scheme. The other class of the MRAM is called spin-transfer torque (STT) switching MRAM. It is believed that the STT-RAM has much better scalability due to its simple memory cell structure. While the data read out mechanism is still based on TMR effect, the data write is governed by physics of spin-transfer effect (J. C. Slonczewski, J. Magn. Magn. Mater. 159, (1996) L1.; L. Berger, Phys. Review B 54 (1996) 9353.). Despite of intensive efforts and investment, even with the early demonstrated by Sony in late 2005 (M. Hosomi et al., 2005 IEDM Technical Digest (2005) p 459), no commercial products are available on the market so far. One of the biggest challenges of STT-RAM is its reliability, which depends largely on the value and statistical distribution of the critical current density needed to flip the magnetic storage layers within every patterned TMR stack used in the MRAM memory structures. Currently, the value of the critical current density is still in the range of $10^6$ $A/cm^2$. To allow such large current density through the dielectric barrier layer such as AlOx and MgO in the TMR stack, the thickness of the barrier has to be relatively thin, which not only limits the magnetoresist (MR) ratio value but also causes potential risk of the barrier breakdown. As such, a large portion of efforts in developing the STT-RAM is focused on lower the critical current density while still maintaining the thermal stability of the magnetic data storage layer. Another challenge is related partially to the engineering challenge due to the imperfection of the memory cell structure patterning (patterned TMR element), such as edge magnetic moment damage, cell size variation, non-uniformity of the barrier thickness, non-uniformity of magnetic properties in both the data storage layer and the spin polarized magnetic layer (also called reference layer). Such imperfections ultimately cause the statistic variation of critical current density needed for each patterned cell.

The success of the STT-RAM largely depends on the materials used in STT-RAM, which should give a fair balance between the barrier thickness (related to broken down voltage and TMR ratio), critical current density and thermal stability of the magnetic storage layer.

In this invention, we propose two new MRAM memory cell structures with a new write mechanism based on the latest finding by I. M. Miron et al. (I. M. Miron et. al, Nature 476, (2011) 189). The advantages of the our new designs are: 1) write current does not pass through TMR barrier as the conventional MRAM does to avoid the reliability concerns of STT-RAM; 2) the cell structure is simpler than the conventional MRAM as it does not need toggle write scheme; 3) one of our designs has a very good scalability; 4) the other of our designs decouples the read and write elements. This means that we can individually optimize the read and write components. For example, we can focus on improvement of the MR ratio of read element while, for write element, we can put emphasis on the reliable switching.

SUMMARY OF THE INVENTION

The present invention of the proposed memory cells for the new types of the MRAM includes, at least, a magnetic data storage layer with perpendicular anisotropy, whose two opposite orientations of the magnetization corresponds to digital "1" and "0". The magnetic data storage layer is sandwiched between two dissimilar interfaces, one of which is an interface between the magnetic layer and a layer made from a heavy, non-magnetic element while the other side is a dielectric layer. The metallic layer made of heavy, non-magnetic element also acts as a switching-current-carrying layer, in which a pulse current flowing in the plane of the layer is used to switch the magnetization of the magnetic data storage layer from one direction to another (flip-flop) by change the pulse current flowing direction. The proposed memory cell has a pattern TMR stack which is used as probing device to detection (or "read out") the state of "1" or "0" stored in the magnetic data storage layer. Preferably, the magnetic layer in the TMR stack also has perpendicular anisotropy.

In this invention, there are two new types of MRAM cells. In one kind of the cells, magnetic storage layer is separated away from the TMR stack while, in the other kind, the magnetic storage layer is part of the TMR stack.

BRIEF DESCRIPTION OF THE DRAWINGS

FIG. 4 (B) Illustrates the embodiments (bottom TMR configuration) of the cross section of the memory cell shown in FIG. 4A, where the data storage layer is a part of the read-out sensing TMR stack.

DETAILED DESCRIPTION

The following description is provided in the context of particular designs, applications and the details, to enable any person skilled in the art to make and use the invention. However, for those skilled in the art, it is apparent that various modifications to the embodiments shown can be practiced with the generic principles defined here, and without departing the spirit and scope of this invention. Thus, the present invention is not intended to be limited to the embodiments shown, but is to be accorded the widest scope consistent with the principles, features and teachings disclosed here.

The present invention relates to memory cell for a new class of the MRAM. While the memory cell still uses the patterned TMR stack as the data sensing or information read-out method, the data written scheme is based a new phenomenon/observation (I. M. Miron et. al, Nature 476, (2011) 189), in which an in-plane current is used to switch the magnetization in a thin magnetic layer with perpendicular anisotropy from one direction to the opposite one by switching the current flow direction.

Figure 1A:
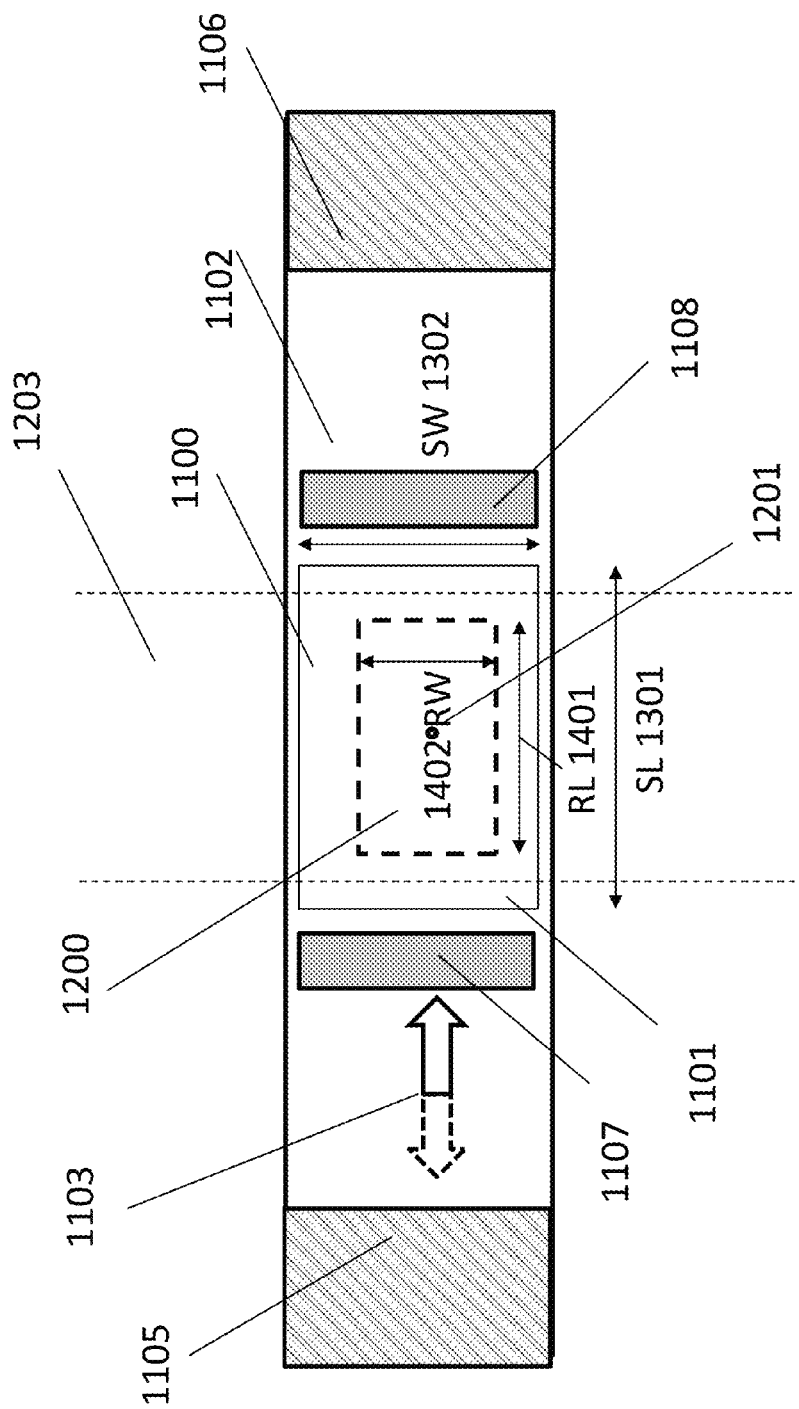
FIG. 1A illustrates one of the embodiments of the top down view of a memory cell, where the data storage layer is not part of the read-out sensing TMR stack.
Figure 1B:
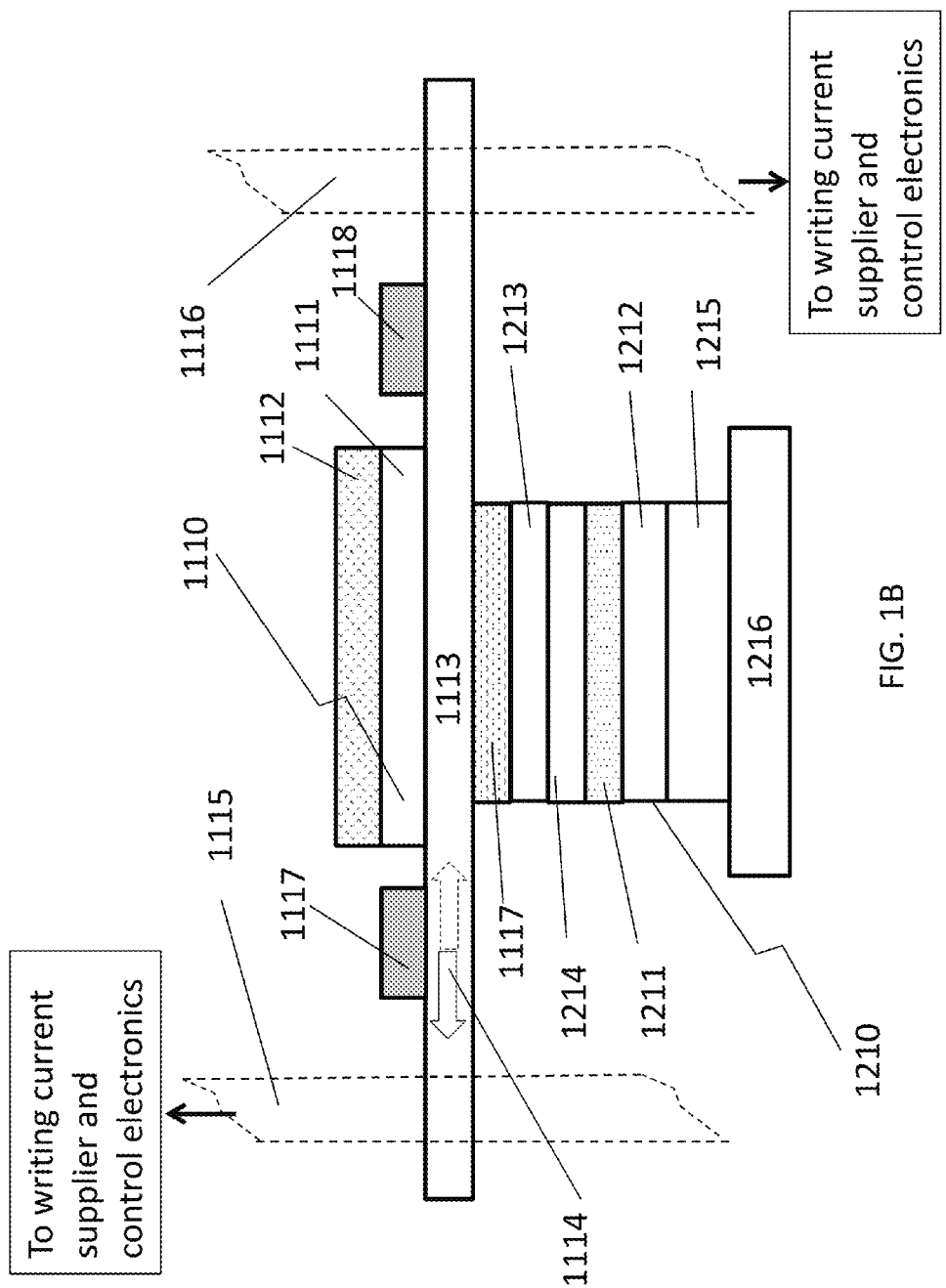
FIG. 1B illustrates one of the embodiments of the cross section layout of a memory cell.

With reference of the FIG. 1A showing the top down projected view, the proposed MRAM memory cell consists a data storage component 1100 and read-out sensing component 1200 made of patterned TMR stack. The data storage component 1100 consists of a patterned magnetic storage layer 1101 sandwiched between a write current carrying layer 1102 made of heavy non-magnetic metal (e.g. Pt, Pd, Re, Rh, Au or their alloy) and a dielectric layer such as AlOx, MgO, SiO2 and SiN (ref. FIG. 1B). The magnetic storage layer has a perpendicular magnetic anisotropy (magnetization direction normal to the growth plane) and is made of thin magnetic materials (e.g Co, Fe, CoFe, CoFeB, or their multilayer such as Co/CoFeB). The thickness of the magnetic storage layer 1101 is between 0.2 nm and 5 nm. The pulse writing current 1103 in the current-carrying layer 1102 can be switched back and forward (as indicated by the arrow in the figure) to flip-and-flop the magnetization within the data storage layer 1101. The current-carrying layer 1102 has two vertical connections via 1105 and 1106 to allow the vertical connection to metallic conductive line or control electronic device such as a transistor. There are two permanent magnets (1107 and 1108) with in-plane magnetic anisotropy adjacent to the data storage layer 1101. The permanent magnets are made of materials such as CoCrPt, CoPt, CoZrPt, FeCoCr, FeCoPt, AlNiCo, FeCrPd etc. The magnetization of the two permanent magnets (1107 and 1108) is set by the external magnetic field roughly parallel to the current flow direction as indicated by 1103. The fringe field from the two permanent magnets provides bias field in plane bias field to the data storage layer. The optimized fringe field strength is between 3 mT to 0.5 T.

Although the exact shape of the patterned TMR stack can be different based on design and wafer process, we use a rectangle shape device here for illustration. The patterned magnetic storage layer has a top down projected storage layer length (SL) 1301 and storage layer width (SW) 1302. The patterned TMR stack has a projected read-out length (RL) 1401 and read-out width (RW) 1402. The thickness of TMR stack is governed by the detailed design of the sensing TMR stack configuration. The dimensions of the projected TMR stack, both RL (1401) and RW (1402) is similar to or preferably smaller than the correspondent dimensions of the magnetic storage layer (i.e. SL (1301) and SW (1302)). The magnetic layers within the TMR stack preferably have perpendicular magnetic anisotropy, which means that the orientation of magnetization of the magnetic layer within TMR stack is normal to growth plane. Although there are no firm requirements in terms of the ratio between the SL (1301) and SW (1302) or RL (1401) and RW (1402), for the patterned TMR stack, an aspect ratio (RL/RW) larger than 1.5 (preferably large than 3.5) can be deliberately introduced to enhance shape anisotropy of the pattern TMR stack. By doing so, the impact/disturb from the magnetic field generated by the pulse data writing current on the magnetic free layer can be reduced. The exact shape of the magnetic storage layer and projected patterned TMR are not specified here. It can be square, circle, oval and rectangle. Nevertheless, the shape optimization can be implemented. For the data storage layer, the purpose of shape optimization is to reduce the switching current density while the purpose of the shape optimization for the projected TMR stack is to reduce the disturb from the pulse writing current on the magnetic free layer within TMR stack. Preferably, the center of the projected TMR stack 1201 sits on or close to the projected center line of the current carrying.

FIG. 1B illustrates the cross section view of one of the embodiments for the proposed memory cell showing in FIG. 1A. In this figure, the storage component 1110 consists at least three layers: the write current-carrying layer 1113, the magnetic data storage layer 1111 and dielectric capping layer for data storage layer 1112. The write current-carrying layer 1113 is made of heavy non-magnetic metal (e.g. Pt, Pd, Re, Rh, Au or their alloy). The capping layer 1112 layer is made of dielectric materials such as AlOx, MgO, SiO2 and SiN. The magnetic storage layer 1111 has a perpendicular magnetic anisotropy (magnetization direction normal to the growth plane) and is made of thin magnetic materials (e.g Co, Fe, CoFe, CoFeB or their multilayer such as Co/CoFeB). The thickness of the magnetic storage layer is between 0.2 nm and 5 nm. The pulse writing current 1114 can flow forward or backward, which is controlled by the data writing electronic device. The write current-carrying layer 1113 has a vertical connection via 1115 and 1116, which are connected to metallic conductive line or control electronic device such as a transistor. There are two permanent magnets (1117 and 1118) with in-plane magnetic anisotropy adjacent to the data storage layer 1111. The permanent magnets are made of materials such as CoCrPt, CoPt, CoZrPt, FeCoCr, FeCoPt, AlNiCo, FeCrPd etc. The magnetization of the two permanent magnets (1117 and 1118) is set by the external magnetic field roughly parallel to the current flow direction as indicated by 1114. The fringe field from the two permanent magnets provides bias field in plane bias field to the data storage layer. The optimized fringe field strength is between 3 mT to 0.5 T.

A patterned TMR stack 1210 is locating below the dielectric spacing layer 1117, which separates the TMR stack 1210 and data storage component 1110. It acts as a sensing device to sense the magnetic direction (pointing either up or down of the growth plane). This is very much similar to the magnetic reader made of TMR stack to detect the magnetization direction in the magnetic medium. The patterned TMR stack at least have a top metallic capping layer 1213, which is also used to carry the sensing current through the TMR stack; a magnetic free layer 1214 preferably with perpendicular magnetic anisotropy; a dielectric barrier layer made of materials such as AlOx, MgO, CrOx or TiOx; a magnetic reference layer 1212 with pinned magnetization orientation also preferably with perpendicular magnetic anisotropy as free layer 1214; pinning assistant layer 1215 and bottom metallic seed layer 1216 for induce anisotropy and acting as sensing current-carrying lead. The pinning assistant layer 1215 can be optional and made of a single magnetic layer with perpendicular anisotropy such as CoPt or multilayer Co/Pt, or even more complicated structure as so-called synthetic antiferromagnetic structure. The design principle of the TMR sensing stack is such that the magnetization configuration within the free layer 1214 can be altered only depending on the magnetization direction in the data storage layer 1111 while the magnetization within magnetic reference layer 1212 is fixed and without change during the process of data writing and reading.

Figure 2:
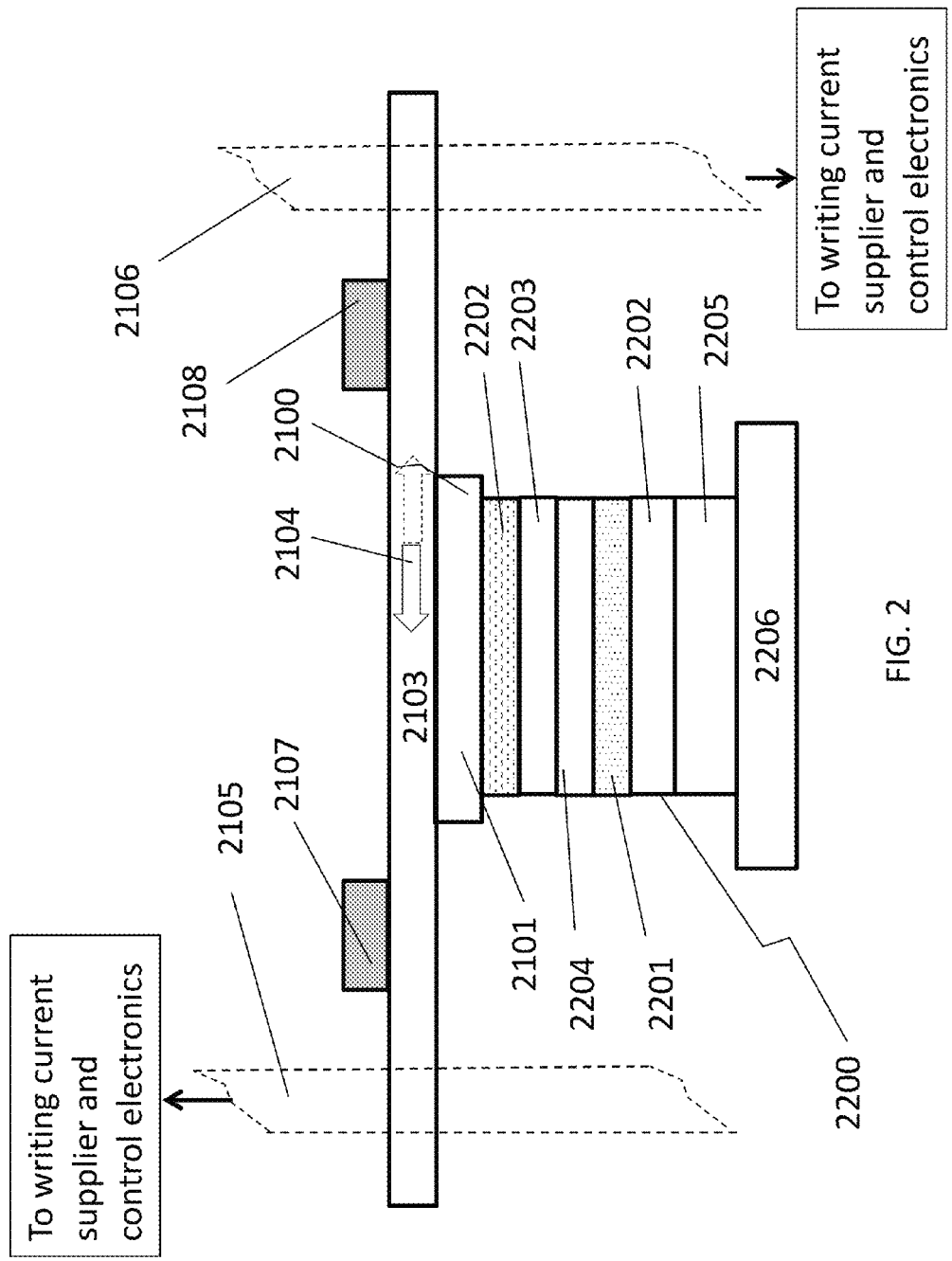
FIG. 2 illustrates another embodiment of the cross section and top down views of a memory cell.

FIG. 2 illustrates the cross section view of another embodiment for the proposed memory cell design showing in FIG. 1A. In this figure, comparing with FIG. 1B, the storage component 2100 is upside down and consists at least three layers: the write current-carrying layer 2103, the magnetic data storage layer 2101 and dielectric spacing layer 2202, which is directly over the TMR stack capping layer 2203. The write current-carrying layer 2103 is made of heavy non-magnetic metal (e.g. Pt, Pd, Re, Rh, Au or their alloy). The spacing layer 2202 layer is made of dielectric materials such as AlOx, MgO, SiO2 or SiN. The magnetic storage layer 2101 has a perpendicular magnetic anisotropy (magnetization direction normal to the growth plane) and is made of thin magnetic materials (e.g Co, Fe, CoFe, CoFeB or their multilayer such as Co/CoFeB). Although it is shown in FIG. 2 that the dimension of the data storage layer 2101 is larger than the TMR stack, the size can be vary in the real case for the sake of process friendly. The thickness of the magnetic storage layer is between 0.2 nm and 5 nm. The pulse writing current 2104 can flow forward or backward, which is controlled by the data writing electronic device. The write current-carrying layer 2103 has a vertical connection via 2105 and 2106, which is connected to metallic conductive line or control electronic device such as a transistor. There are two permanent magnets (2107 and 2108) with in-plane magnetic anisotropy adjacent to the data storage layer 2101. The permanent magnets are made of materials such as CoCrPt, CoPt, CoZrPt, FeCoCr, FeCoPt, AlNiCo, FeCrPd etc. The magnetization of the two permanent magnets (2107 and 2108) is set by the external magnetic field roughly parallel to the current flow direction (as indicated by 2104). The fringe field from the two permanent magnets provides bias field in plane bias field to the data storage layer. The optimized fringe field strength is between 3 mT to 0.5 T.

A patterned TMR stack 2200 is located below the spacing layer 2202. It acts as a sensing device to sense the magnetic direction (pointing either up or down of the growth plane). The patterned TMR stack at least have a top metallic capping layer 2203, which is also used to carry the sensing current through the TMR stack; a magnetic free layer 2204 preferably with perpendicular magnetic anisotropy; a dielectric barrier layer made of materials such as AlOx, MgO, CrOx or TiOx; a magnetic reference layer 2202 with pinned magnetization orientation also preferably with perpendicular magnetic anisotropy as free layer 2204; pinning assistant layer 2205 and bottom metallic seed layer 2206 for induce anisotropy and acting as (bottom) sensing current-carrying lead. The pinning assistant layer 2205 can be optional and made of a single magnetic layer with perpendicular anisotropy such as CoPt or multilayer Co/Pt, or even more complicated structure as so-called synthetic antiferromagnetic structure. The design principle of the TMR sensing stack is such that the magnetization configuration within the free layer 2204 can be altered only depending on the magnetization direction in the data storage layer 2101 while the magnetization within magnetic reference layer 2202 is fixed and without change during the process of data writing and reading.

Figure 3:
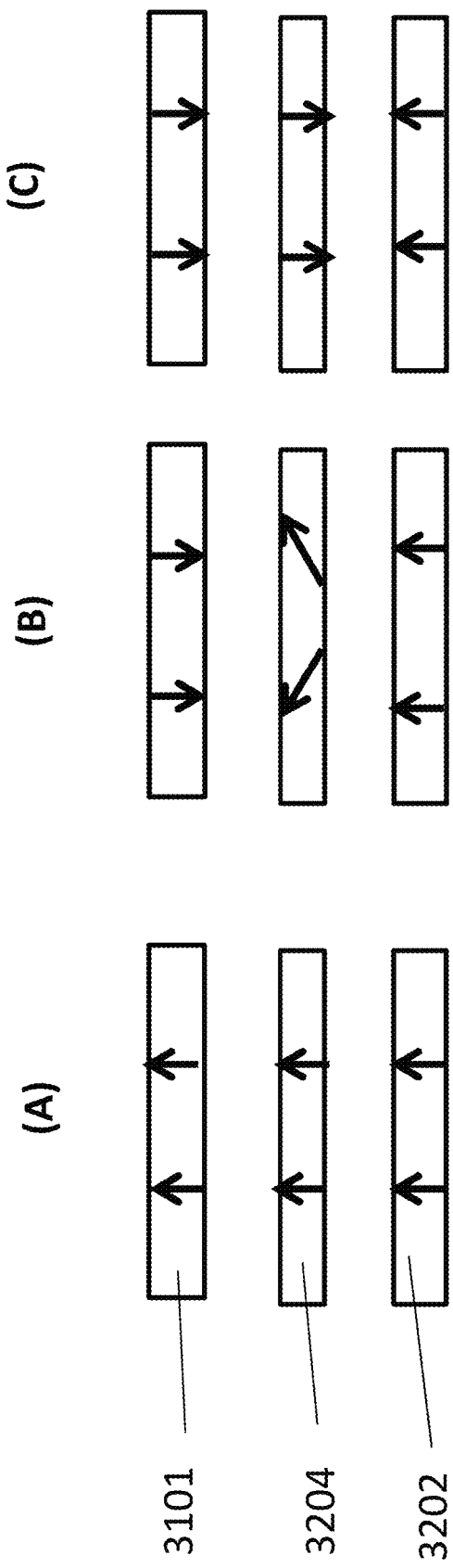
FIG. 3 (A), (B), (C) illustrates the embodiments of the cross section of magnetic configuration in the data storage layer and in the sensing TMR stack of a memory cell. All the magnetic layers showing here have perpendicular magnetic anisotropy.

FIG. 3. shows the cross section of magnetic configuration in the data storage layer and in the sensing TMR stack of a memory cell shown in FIG. 1 for the current invention. All the magnetic layers showing here have perpendicular magnetic anisotropy. To better illustrate the principle of sensing the magnetization of the data storage layer 3101, a simplified drawing of the patterned TMR, which only shows the magnetic free sensing layer 3204 and pinned magnetic reference layer 3202, is used. The arrows are used to schematically represent the magnetization directions in every magnetic layer involved in our proposed MRAM memory cell. As descripted previously, the magnetization of pinned magnetic reference layer 3202 cannot change during the process of reading and writing. FIG. 3(A) represents an initial magnetic configuration of the three magnetic layers of the memory cell. The output resistance from the pattern TMR stack is low. If a consistent sensing current is used, the output potential is low in this configuration. When a direction polarized pulse writing current is applied, the magnetization of the storage layer 3101 is change from up-pointing to down-pointing configuration. The magnetization within the magnetic free sensing layer 3204 will be altered depending on the relation between the magnetic field strength emitting from the data storage 3101 and coercivity of the magnetic free sensing layer 3204. If the field strength is smaller than the coercivity, the magnetization configuration, as shown in FIG. 3(B), appears. If the field strength is larger than the coercivity, the magnetization configuration as shown in FIG. 3(C), will appear. For both cases, the pattern TMR stack will show higher resistant characteristic to the sensing current and output potential will be higher.

Figure 4A:
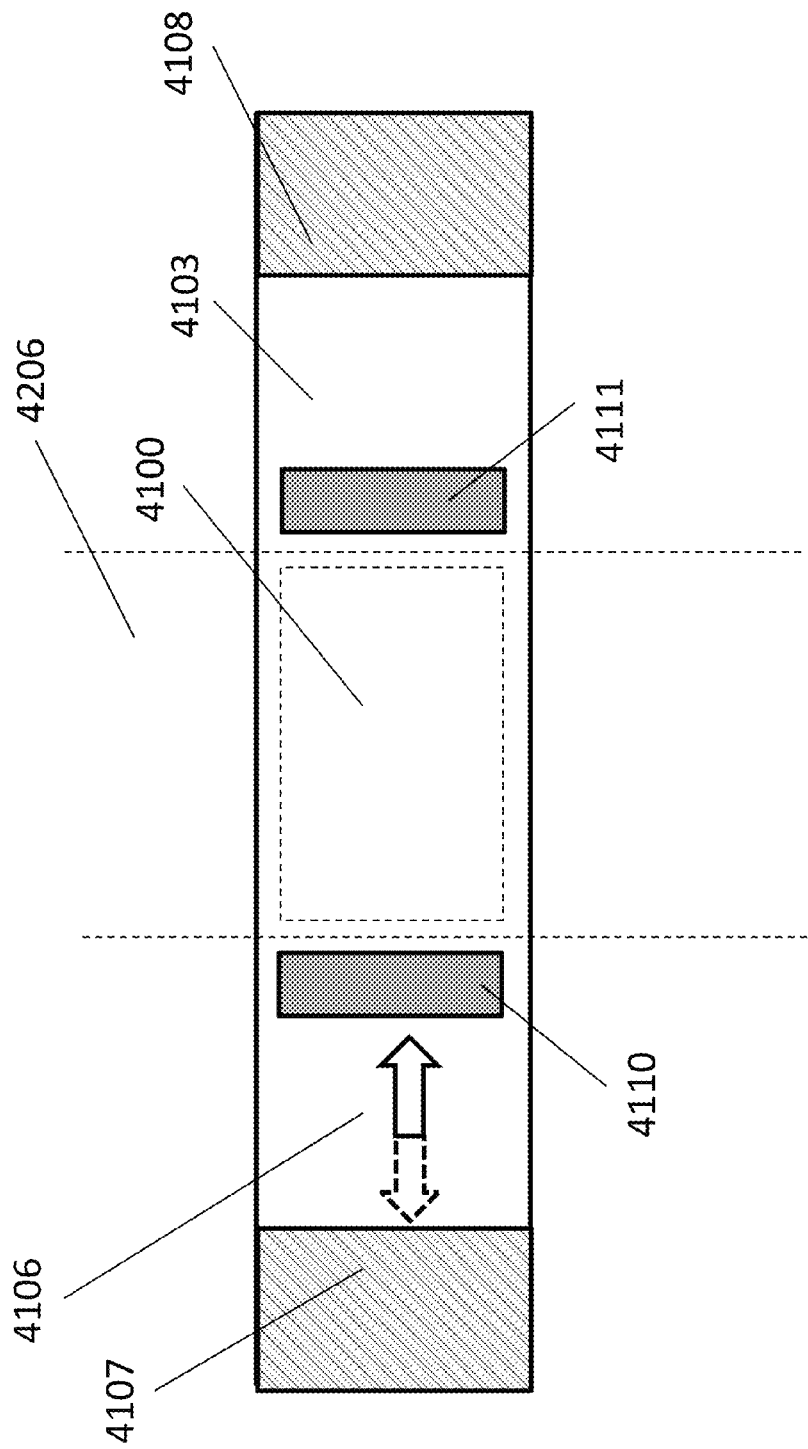
FIG. 4 (A) illustrates one of the embodiments of the top down view of another memory cell.

FIG. 4A illustrates one of the embodiments of the top down view of another memory cell of the current invention. The pattern TMR stack including the data storage layer labeled as 4100 and writing-current carrying layer 4103 with switchable current 4106 and two vertical connection paths (via) 4107 and 4108, which is linked to metallic conductive line or control electronic device such as a transistor. There are two permanent magnets (4110 and 4111) with in-plane magnetic anisotropy adjacent to the data storage layer. The permanent magnets are made of materials such as CoCrPt, CoPt, CoZrPt, FeCoCr, FeCoPt, AlNiCo, FeCrPd etc. The magnetization of the two permanent magnets (4110 and 4111) is set by the external magnetic field roughly parallel to the current flow direction (as indicated by 4106). The fringe field from the two permanent magnets provides bias field in plane bias field to the data storage layer. The optimized fringe field strength is between 3 mT to 0.5 T. The bottom sensing-current carrying lead is labeled as 4206. The more details of the structures is described in FIG. 4B.

Figure 4B:
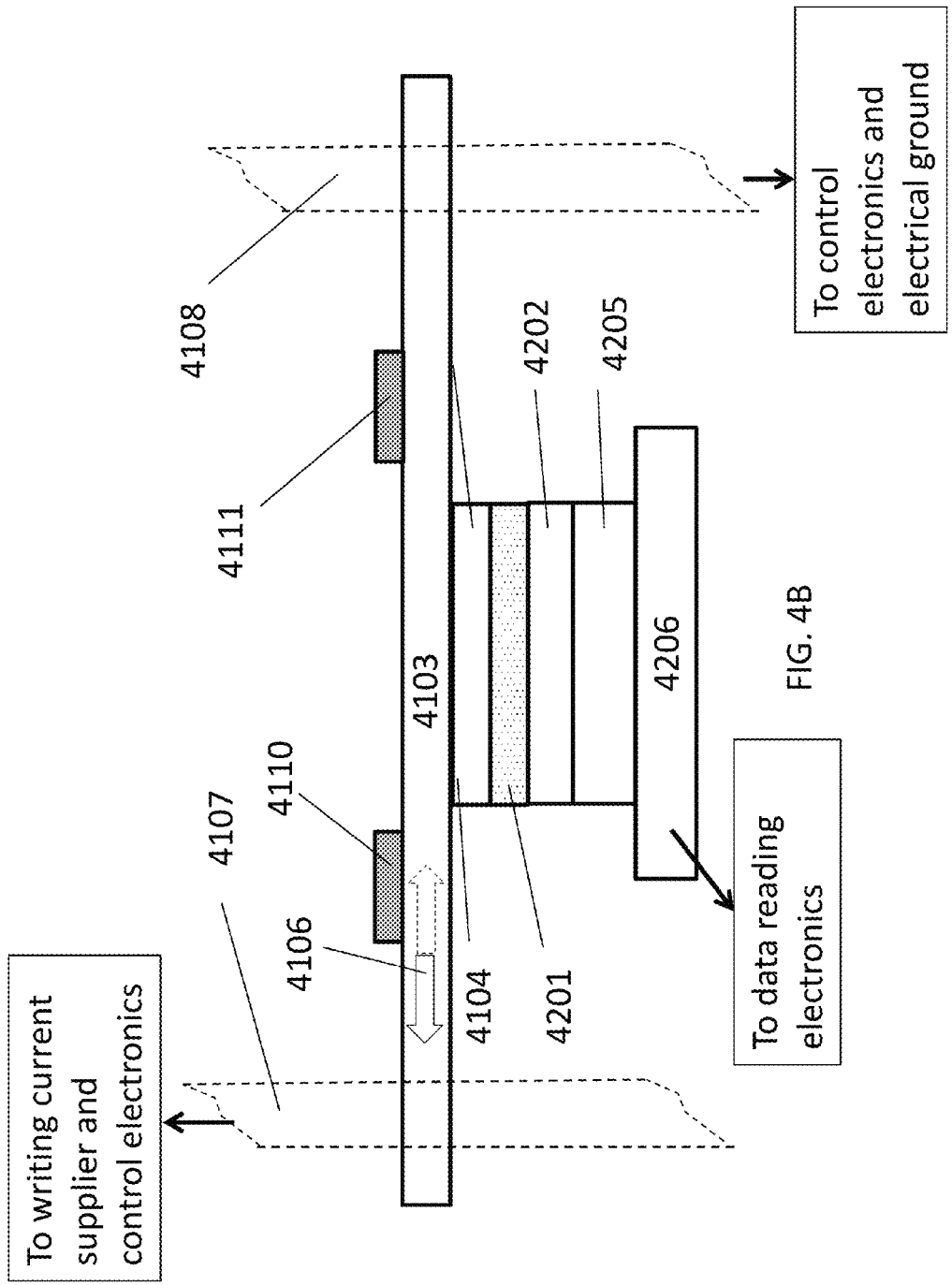

FIG. 4B illustrates one of the embodiments of the cross section of the memory cell for the design 2, essentially a patterned TMR stack with perpendicular magnetic anisotropy for the magnetic free layer. The storage component 4104 also acts as magnetic free layer in the read-out sensing TMR stack while the write current-carrying layer 4103, which is made of heavy non-magnetic metal (e.g. Pt, Pd, Re, Rh, Au or their alloy) also acts as the TMR stack top capping layer. The dielectric spacing layer 4201 is made of dielectric materials such as MgO, AlOx, TiO2 also acts as TMR barrier. The magnetic data storage layer 4104 has a perpendicular magnetic anisotropy (magnetization direction normal to the growth plane) and is made of thin magnetic materials (e.g Co, Fe, CoFe, CoFeB or their multilayer such as Co/CoFeB). The thickness of the magnetic storage layer is between 0.2 nm and 5 nm. The pulse writing current 4106 can flow forward or backward, which is controlled by the data writing electronic device. The write current-carrying layer 4103 has a vertical connection via 4107 and 4108, which are connected to metallic conductive line or control electronic device such as a transistor. There are two permanent magnets (4110 and 4111) with in-plane magnetic anisotropy adjacent to the data storage layer. The permanent magnets are made of materials such as CoCrPt, CoPt, CoZrPt, FeCoCr, FeCoPt, AlNiCo, FeCrPd etc. The magnetization of the two permanent magnets (4110 and 4111) is set by the external magnetic field roughly parallel to the current flow direction (as indicated by 4106). The fringe field from the two permanent magnets provides bias field in plane bias field to the data storage layer. The optimized fringe field strength is between 3 mT to 0.5 T. The bottom part of the patterned TMR stack at least includes a magnetic reference layer 4202 with pinned magnetization orientation, a perpendicular magnetic anisotropy layer as free layer 4104, a pinning assistant layer 4205, and a bottom metallic seed layer 4206 for inducing anisotropy and acting as sensing current-carrying lead. The pinning assistant layer 4205 can be optional and made of a single magnetic layer with perpendicular anisotropy materials such as CoPt or multilayer Co/Pt, or even more complicated structure as so-called synthetic antiferromagnetic structure. The design principle of the TMR sensing stack is such that the magnetization configuration within the data storage layer 4104 can be altered by the pulse data writing current while the magnetization within magnetic reference layer 4202 is fixed and without change during the process of data writing and reading.

Figure 5A:
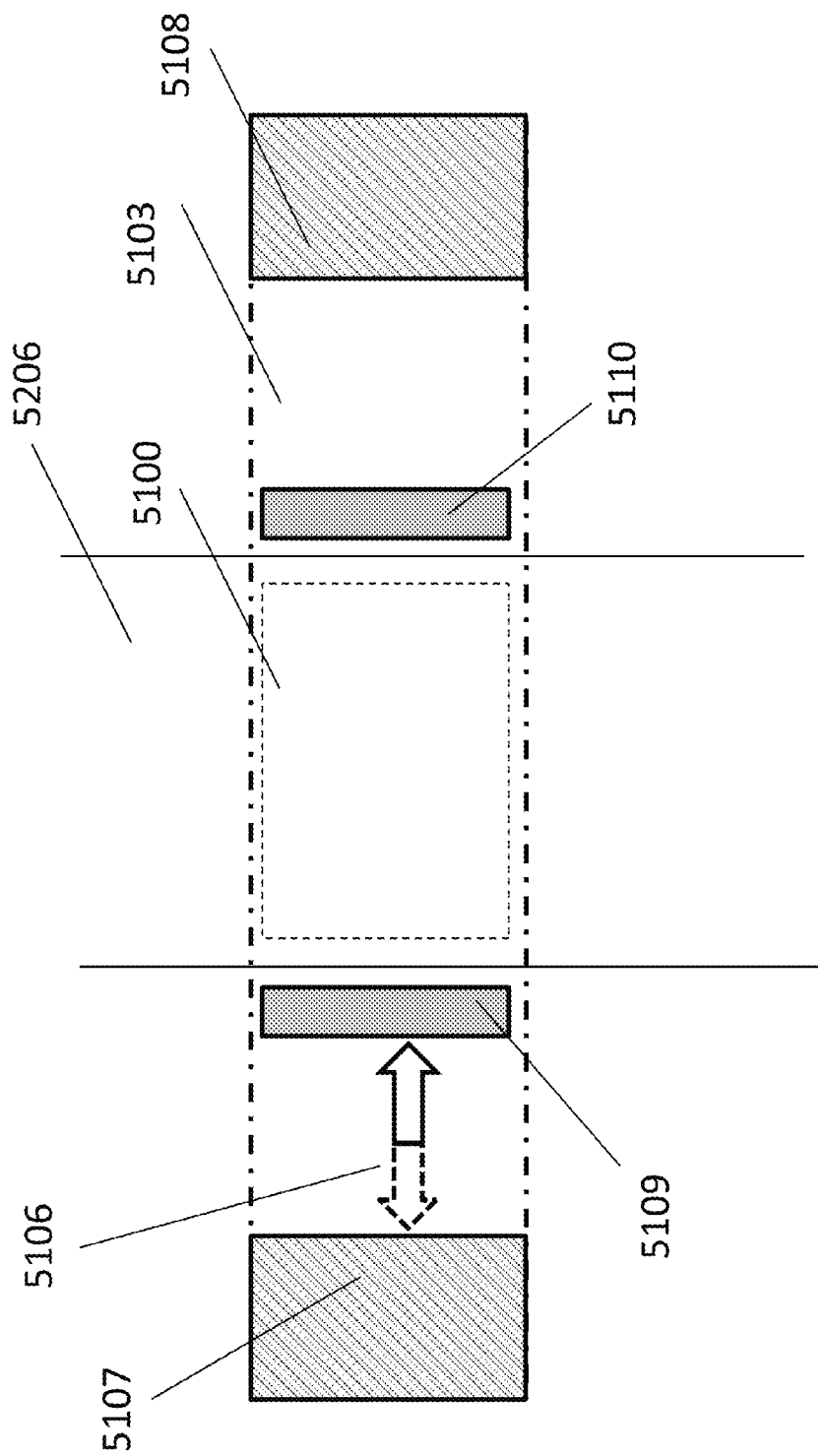
FIG. 5 (A) illustrates another embodiment of the top down view of another memory.
FIG. 5(B) Illustrates the embodiments (top TMR configuration) of the cross section of the memory cell shown in FIG. 5A, where the data storage layer is a part of the read-out sensing TMR stack, for the current invention.

FIG. 5A illustrates one of the embodiments of the top down view of the memory cell for the design 2 of the current invention. The pattern TMR stack includes the data storage layer labeled as 5100 and the writing-current carrying layer 5103 and two vertical connection paths (via) 5107 and 5108, which are linked to metallic conductive line or control electronic device such as a transistor. There are two permanent magnets (5109 and 5110) with in-plane magnetic anisotropy adjacent to the data storage layer. The permanent magnets are made of materials such as CoCrPt, CoPt, CoZrPt, FeCoCr, FeCoPt, AlNiCo, FeCrPd etc. The magnetization of the two permanent magnets (5109 and 5110) is set by the external magnetic field roughly parallel to the current flow direction (as indicated by 5106). The fringe field from the two permanent magnets provides bias field in plane bias field to the data storage layer. The optimized fringe field strength is between 3 mT to 0.5 T. The more details of the structures is described in FIG. 5B.

Figure 5B:
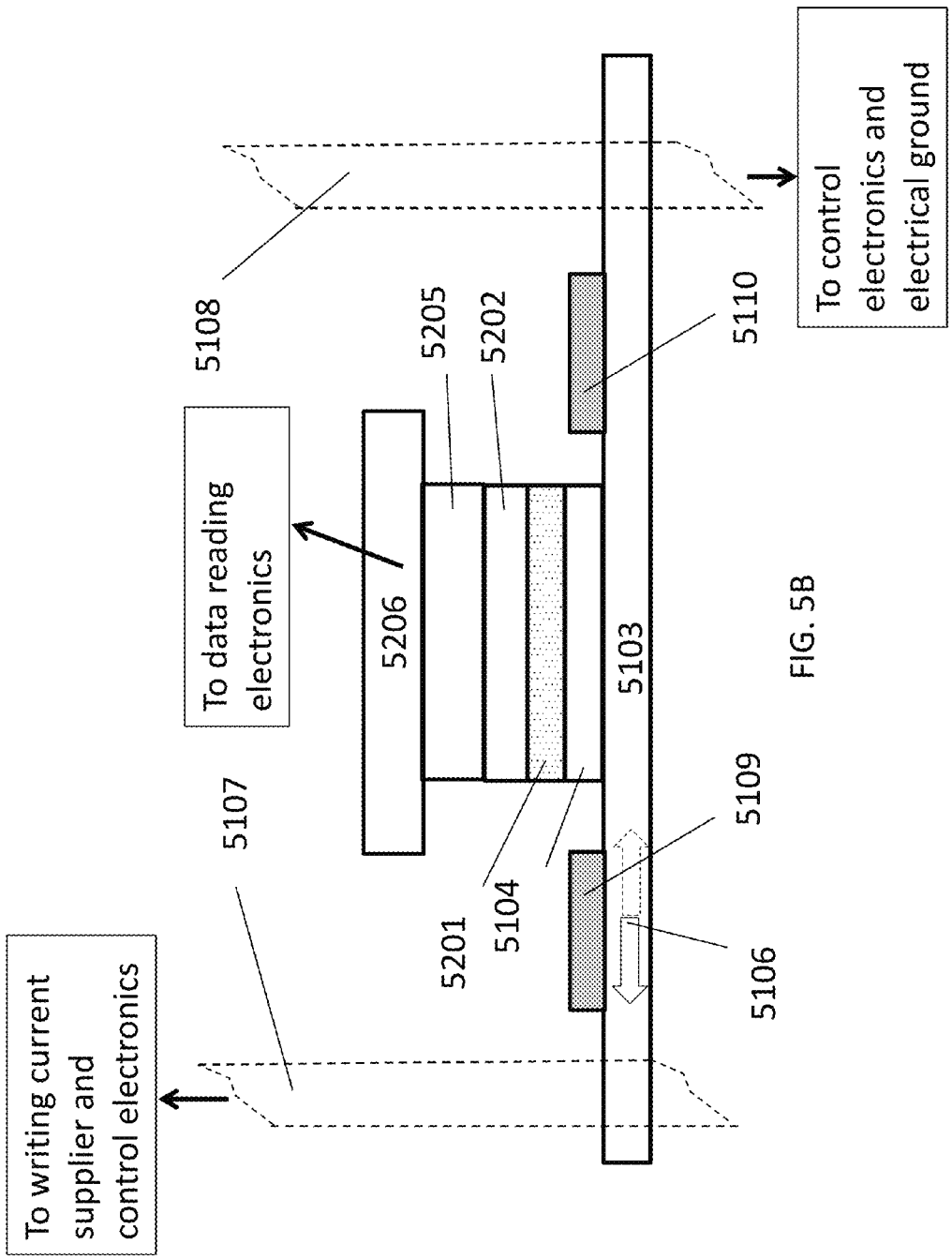

FIG. 5B illustrates one of the embodiments of the cross section of the memory cell for the design 2, essentially a patterned TMR stack with perpendicular magnetic anisotropy for the magnetic free layer. The storage layer 5104 also acts as magnetic free layer in the read-out sensing TMR stack while the write current-carrying layer 5103, which is made of heavy non-magnetic metal (e.g. Pt, Pd, Re, Rh, Au or their alloy) also acts as the TMR seed layer and bottom current lead. The dielectric spacing layer 5201 is made of dielectric materials such as MgO, AlOx, TiO2 also acts as TMR barrier. The magnetic data storage layer 5104 has a perpendicular magnetic anisotropy (magnetization direction normal to the growth plane) and is made of thin magnetic materials (e.g Co, Fe, CoFe, CoFeB or their multilayer such as Co/CoFeB). The thickness of the magnetic storage layer is between 0.2 nm and 5 nm. The pulse writing current 5106 can flow forward or backward, which is controlled by the data writing electronic device. The write current-carrying layer 5103 has a vertical connection via 5107 and 5108, which are connected to metallic conductive line or control electronic device such as a transistor. There are two permanent magnets (5109 and 5110) with in-plane magnetic anisotropy adjacent to the data storage layer. The permanent magnets are made of materials such as CoCrPt, CoPt, CoZrPt, FeCoCr, FeCoPt, AlNiCo, FeCrPd etc. The magnetization of the two permanent magnets (5109 and 5110) is set by the external magnetic field roughly parallel to the current flow direction (as indicated by 5106). The fringe field from the two permanent magnets provides bias field in plane bias field to the data storage layer. The optimized fringe field strength is between 3 mT to 0.5 T. The top part of the patterned TMR stack at least includes a magnetic reference layer 5202 with pinned magnetization orientation, a perpendicular magnetic anisotropy layer as free layer 5104, a pinning assistant layer 5205, and a bottom metallic seed layer 5206 for inducing anisotropy and acting as sensing current-carrying lead. The pinning assistant layer 5205 can be optional and made of a single magnetic layer with perpendicular anisotropy such as CoPt or multilayer Co/Pt, or even more complicated structure as so-called synthetic antiferromagnetic structure. The design principle of the TMR sensing stack is such that the magnetization configuration within the data storage layer 5104 can be altered by the pulse data writing current while the magnetization within magnetic reference layer 5202 is fixed and without change during the process of data writing and reading.

Figure 6:
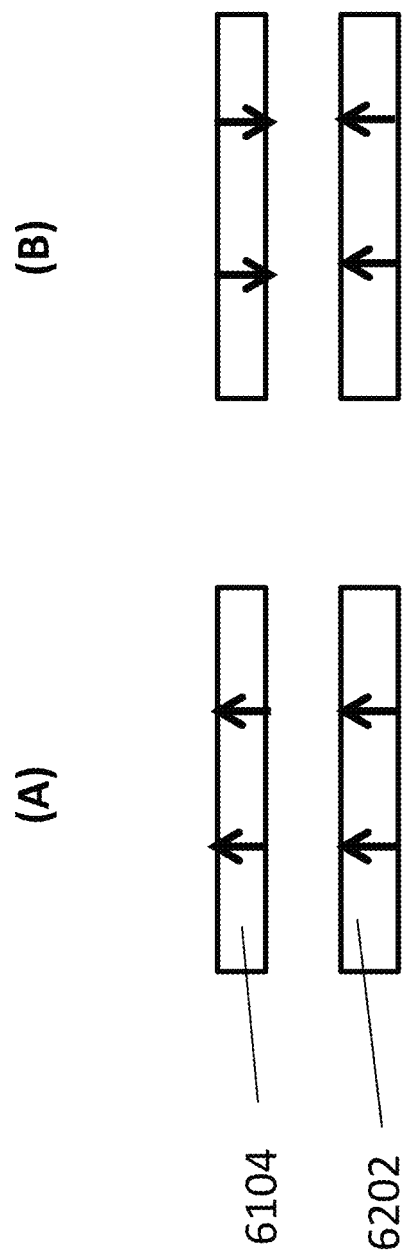
FIGS. 6(A) and 6(B) illustrate the embodiments of the cross section of magnetic configuration in the data storage layer and in the sensing TMR stack of a memory cell.

FIG. 6(A) and FIG. 6(B) shows the cross section of magnetic configuration in the data storage layer and in the sensing TMR stack of the design 2 for the current invention in FIG. 4. All the magnetic layers showing here have perpendicular magnetic anisotropy. To better illustrate the principle of sensing the magnetization of the data storage layer 6104, a simplified drawing of the data storage layer 6104 and pinned magnetic reference layer 6202, is used. The arrows are used to schematically represent the magnetization direction in every magnetic layer involved in our proposed MRAM memory cell. As descripted previously, the magnetization of pinned magnetic reference layer 6202 cannot change during the process of reading and writing. FIG. 6(A) represents an initial magnetic configuration of the two magnetic layers of the memory cell. The output from the pattern TMR stack is low resistant. If a consistent sensing current is used, the output potential is low in this configuration. When a directionally polarized pulse writing current is applied, the magnetization of the storage layer 6104 is change from up to down configuration as shown in FIG. 6(B), the patterned TMR stack will show higher resistant characteristic to the sensing current and output potential will be higher. The same principle can be applied for the memory cell design shown in the FIG. 5.

What is claimed is:
1. A memory cell comprising:
  a. At least a perpendicular magnetic data storage layer, sandwiched between a non-magnetic heavy metal layer and a dielectric layer, wherein said storage layer's magnetization direction is switchable between up-pointing and down-pointing by an in-plane pulsed writing current in the non-magnetic heavy metal layer;
  b. At least a permanent magnet close to said data storage layer to provide an in-plane bias field to the data storage layer; and
  c. At least a patterned tunneling magnetoresistive stack, which is electrically independent from writing for sensing the magnetization orientation in said data storage layer.
2. The memory cell of claim 1, wherein said perpendicular magnetic data storage layer is made of either Co, Fe, CoFe, CoNi, CoN, CoB, CoP, CoPB, CoFeB, CoFePB, CoNiFe, NiFe, CoFeTb, CoFeNb, CoFeTa, CoFeAl, CoFeN, or a multilayer comprising these materials.
3. The memory cell of claim 1, wherein said non-magnetic heavy metal layer is made of either Pt, Pd, Ir, Au, Re, Rh, Ta, Os, W, Hf, Ag, Cd, Mo, Nb, Zr, or their alloys.
4. The memory cell of claim 1, wherein said permanent magnet's magnetization is set approximately parallel to said in-plane pulsed writing current.
5. The memory cell of claim 1, wherein said permanent magnet is made of either CoCrPt, CoPt, CoZrPt, FeCoCr, FeCoPt, AlNiCo, FeCrPd or the combination of the above alloys.
6. The memory cell of claim 1, wherein said patterned tunneling magnetoresistive stack compromises at least one perpendicular-anisotropy soft magnetic free layer made of either Co, Fe, CoFe, CoFeB, CoFeTb, or CoFeTa, whose magnetization configuration is switchable subject to variation of an external magnetic field; a tunneling barrier made of either AlOx, TiOx, MgO, or CrOx; a magnetization orientation fixed magnetic layer made of either Co, Fe, CoFe, CoFeB, CoFeTb, or CoFeTa.
7. The memory cell of claim 1, wherein said patterned tunneling magnetoresistive stack has a magnetization-fixing reference layer made of a single magnetic layer with perpendicular anisotropy CoPt, or multilayer Co/Pt, or synthetic antiferromagnetic (SAF) structure.
8. The memory cell of claim 1, wherein said non-magnetic heavy metal layer has means for connecting to a writing current supplier and writing control electronics.
9. The memory cell of claim 1, wherein said patterned tunneling magnetoresistive stack has means for connecting to a reading current supplier and reading control electronics.
10. The memory cell of claim 1, wherein said perpendicular magnetic data storage layer is arranged to contact to, or to be separated by a very thin non-magnetic layer without decoupling magnetic coupling from said perpendicular-anisotropy soft magnetic free layer of said patterned tunneling magnetoresistive stack so that the magnetization configuration of said perpendicular-anisotropy soft magnetic free layer of said patterned tunneling magnetoresistive stack is determined by the magnetization direction of said perpendicular magnetic data storage layer.
11. A memory cell made of a patterned perpendicular-anisotropy tunneling magnetoresistive (TMR) structure compromising:
  a. A perpendicular-anisotropy magnetic data storage free layer, sandwiched between a non-magnetic heavy metal layer and a dielectric barrier layer, whose magnetization is changeable by an in-plane pulsed writing current in the heavy metal layer;
  b. At least a permanent magnet close to the data storage layer to provide in-plane bias field to the data storage layer; and
  c. A perpendicular-anisotropy magnetization-fixed reference layer.
12. The memory cell of claim 11, wherein said perpendicular-anisotropy magnetization-fixed reference layer is a single magnetic layer with perpendicular anisotropy CoPt, or multilayer Co/Pt, or synthetic antiferromagnetic (SAF) structure.
13. The memory cell of claim 11 wherein said patterned perpendicular-anisotropy tunneling magnetoresistive structure is a bottom-TMR stack.
14. The memory cell of claim 11, wherein said patterned perpendicular-anisotropy tunneling magnetoresistive structure is a top-TMR stack.
15. The memory cell of claim 11, wherein said perpendicular-anisotropy magnetic data storage free layer is made of either Co, Fe, CoFe, CoNi, CoN, CoB, CoP, CoPB, CoFeB, CoFePB, CoNiFe, NiFe, CoFeTb, CoFeNb, CoFeTa, CoFeAl, CoFeN, or a multilayer comprising these materials.
16. The memory cell of claim 11, wherein said non-magnetic heavy metal layer is made of either Pt, Pd, Ir, Au, Re, Rh, Ta, Os, W, Hf, Ag, Cd, Mo, Nb, Zr, or their alloys.

17. The memory cell of claim 11, wherein said permanent magnet's magnetization is set approximately parallel to said in-plane pulsed writing current.

18. The memory cell of claim 11, wherein said permanent magnet is made of either CoCrPt, CoPt, CoZrPt, FeCoCr, FeCoPt, AlNiCo, FeCrPd, or the combination of the above alloys.

19. The memory cell of claim 11, wherein said perpendicular-anisotropy magnetization-fixed reference layer is made of either Co, Fe, CoFe, CoFeB, CoFeTb, or CoFeTa.

20. The memory cell of claim 11, wherein said non-magnetic heavy metal layer has means for connecting to a writing current supplier and writing control electronics and said perpendicular-anisotropi tunning magnetoresistive stack has means for connecting to a reading current supplier and reading control electronics.

\* \* \* \* \*